United States Patent [19]

Feldman et al.

[11] Patent Number: 4,623,753
[45] Date of Patent: Nov. 18, 1986

[54] WATERTIGHT JUNCTION BOX

[75] Inventors: Steven Feldman, Seminole; Marvin L. Yeager, Clearwater, both of Fla.

[73] Assignee: AMP Incorporated, Harrisburg, Pa.

[21] Appl. No.: 546,792

[22] Filed: Oct. 31, 1983

[51] Int. Cl.[4] ............................................. H05K 5/03
[52] U.S. Cl. ................................. 174/50; 174/65 R; 220/3.8
[58] Field of Search ............... 174/52 S, 52 R, 65 R, 174/53, 57, 58, 59, 50; 220/3.2–3.7, 228, 354, 3.8

[56] References Cited

U.S. PATENT DOCUMENTS

| 795,127 | 7/1905 | Hodgson | 220/354 |
| 1,359,351 | 11/1920 | Gash | 220/228 X |
| 2,422,070 | 6/1947 | Bettencourt | 220/228 |
| 3,951,490 | 4/1976 | Devendorf | 174/59 X |
| 4,208,699 | 6/1980 | Philpott et al. | 174/52 S X |
| 4,244,484 | 1/1981 | Guritz et al. | 220/3.7 |
| 4,265,365 | 5/1981 | Boteler | 174/53 X |
| 4,420,091 | 12/1983 | Thorpe et al. | 174/65 |

Primary Examiner—Arthur T. Grimley
Assistant Examiner—D. A. Tone
Attorney, Agent, or Firm—F. Brice Faller; Robert W. Pitts; Eric J. Groen

[57] ABSTRACT

A watertight enclosure for use in an outdoor junction box for use in housing electrical connections such as solar panel installations includes a mating base and cover. The base is bounded by an upstanding peripheral wall having a channel profiled in the top. The mating cover has an outwardly facing channel formed by upper and lower peripheral parallel flanges. The lower flange on the cover fits into the channel in the box member and the upper flange overlaps the outer wall leaving a slight gap providing the only opening to the otherwise enclosed duct about the periphery of the assembly. Wires passing through bores in the upstanding wall are sealed by compressing elastomeric spheres which bore into conformity with the wires passing therethrough.

13 Claims, 6 Drawing Figures

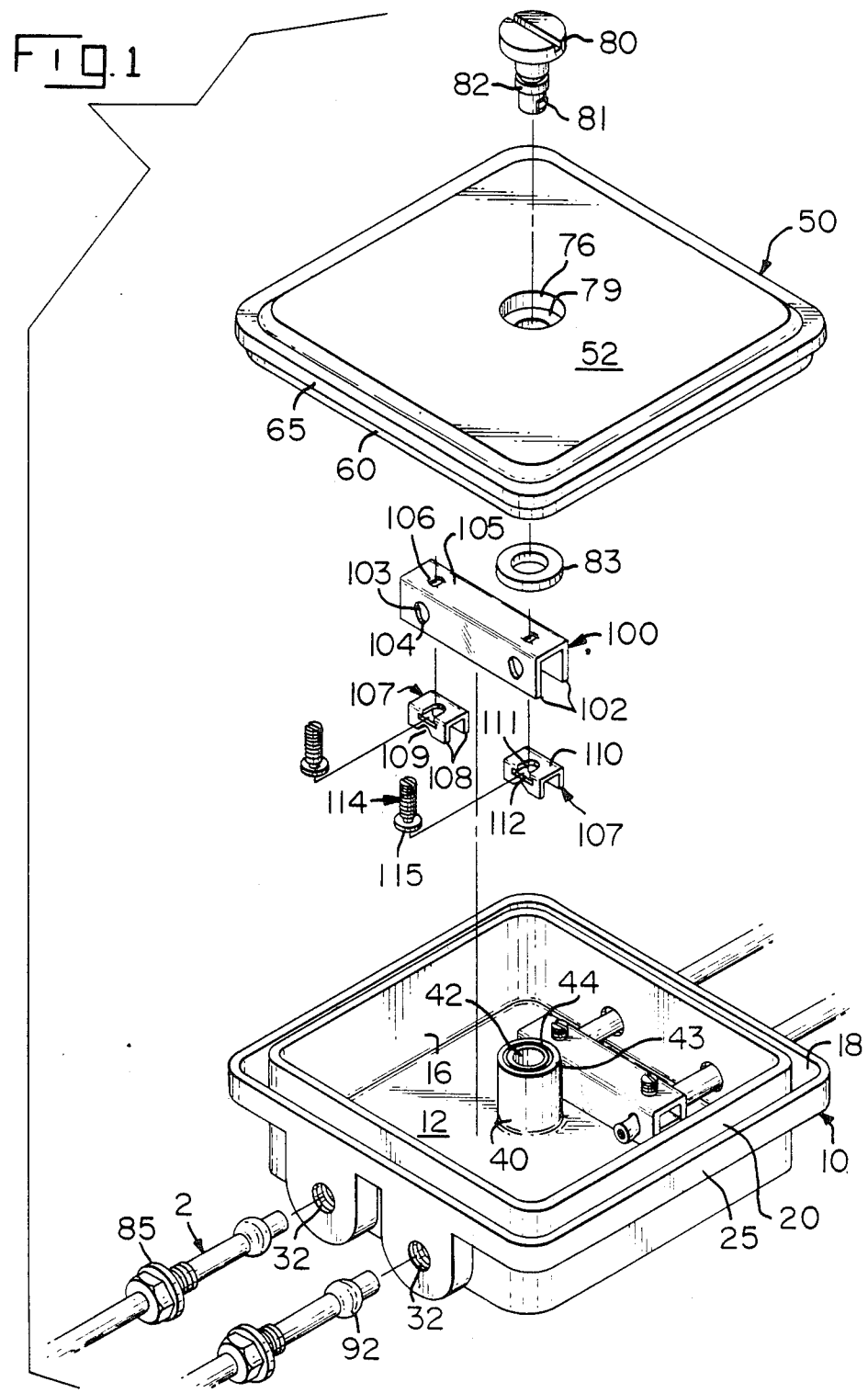

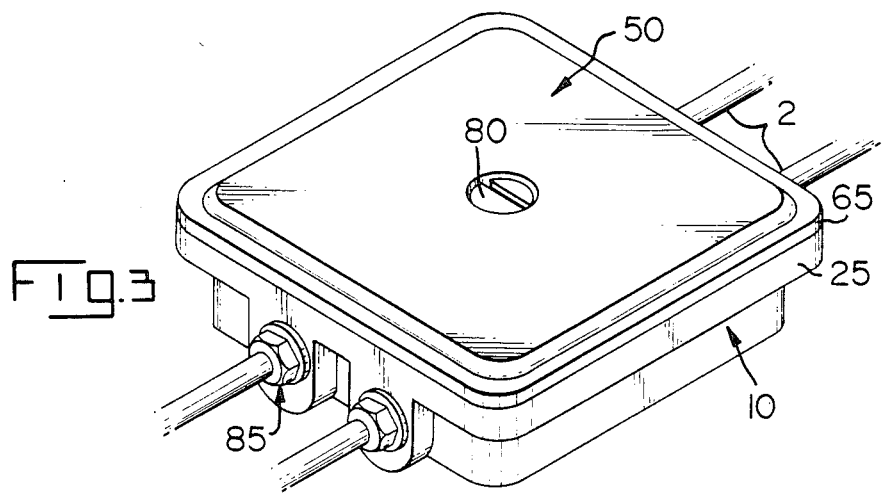
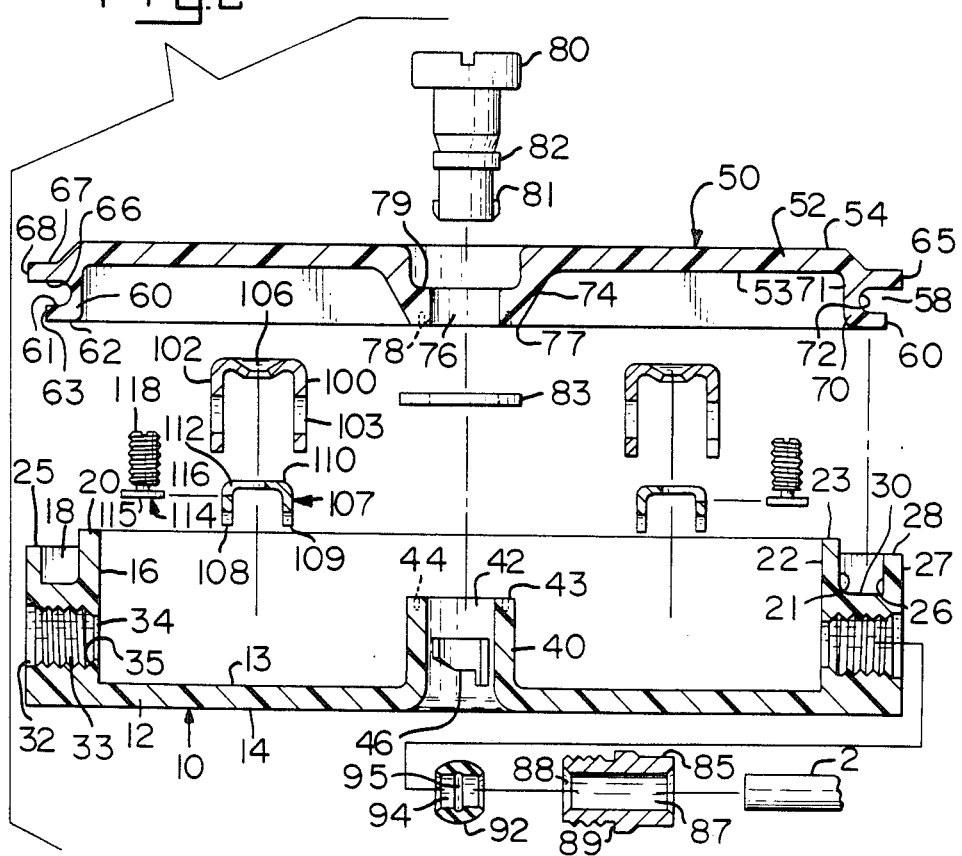

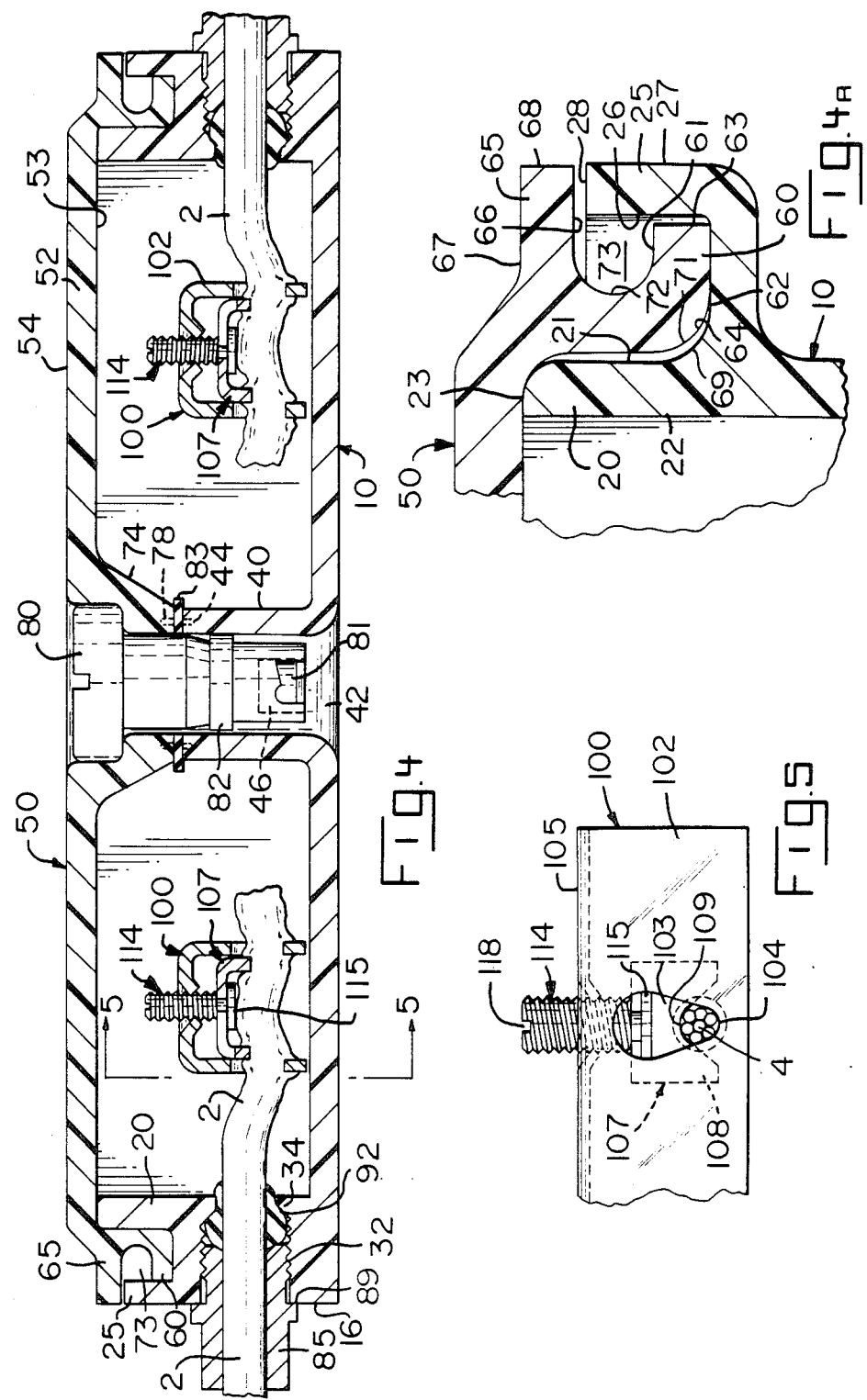

WATERTIGHT JUNCTION BOX

BACKGROUND OF THE INVENTION

The present invention relates to a watertight enclosure for electrical terminals.

Junction boxes for use outdoors, such as for solar panel installations, must be made watertight to prevent water from short circuiting exposed leads inside. This is conventionally accomplished by a deformable seal such as a precut elastomer, closed cell foam, rubber O-rings, etc. As these are discrete items of manufacture and therefore require assembly, they add to cost of manufacture and installation. Further, they are subject to misalignment, damage and deterioration. A junction box which would be impervious to rain water without a discrete seal would not only be less expensive, but easier to assemble and more reliable.

SUMMARY OF THE PRESENT INVENTION

The watertight enclosure or junction box of the present invention comprises a box member and a cover having open peripheral channels which fit together to form an enclosed peripheral duct which prevents water from seeping into the enclosure. A gap between the outside and the duct provides an exit for any water which enters therethrough. The channels are dimensioned so that the duct is large enough to prevent filling with water before it flows out. When the box is mounted horizontally, the duct may fill with water, but a high inner wall assures that water will exit through the gap before entering the enclosure.

Another aspect of the invention is the spherical seals which are collapsed into conformity with the wire in bores through the sidewalls of the box. The spherical shape causes the diametric bore therethrough to collapse uniformly about a wide range of wire sizes so a large section of seals is not necessary.

Yet another aspect of the invention is the terminal used to terminate insulated stranded wire in the housing. The terminal incorporates a stuffer and a screw which is turned to constrict apertures receiving wire. This cuts the insulation and forces the strands into conformity with the apertures.

BRIEF DESCRIPTION OF THE DRAWINGS

FIG. 1 is an exploded perspective of the enclosure.

FIG. 2 is an exploded cross section.

FIG. 3 is a perspective of the assembled enclosure.

FIG. 4 is a cross-sectional view of the assembled enclosure.

FIG. 4A is an enlarged cross section of the mated peripheral channels.

FIG. 5 is an enlarged cross section of a terminated wire.

DETAILED DESCRIPTION OF THE PREFERRED EMBODIMENT

FIG. 1 is an exploded perspective of the watertight enclosure of the present invention, which includes a first closure or box member 10, a second closure member or cover 50, and a cam screw 80 for holding cover 50 and member 10 together. Box member 10 comprises a base 12 having an inner wall 20 and an outer wall 25 defining a channel 18 therebetween. The cover 50 comprises a web 52 with a first or lower flange 60 and a second or upper flange 65 about the periphery thereof. The lower flange 60 is received in channel 18 and held therein as cam screw 80 is seated on shoulder 79 in bore 76 and turned one-quarter turn so that shoulder 81 engages a mating shoulder in bore 42 of hub-like projection 40 in the center of base 12. Insulated wires 2 enter box member 10 through bores 32 where spherical elastomeric seals 92 are deformed by compression bolts 85. The wires 2 are connected to stamped and formed metal terminals 100 by stuffers 107, which force the wires 2 against V-notches 104 in apertures 103 through parallel sidewalls 102. The wires 2 are also forced into V-notches 109 in stuffers 107 as screw 114 is turned in aperture 106 in top bight 105 as will be described.

FIG. 2 is an exploded cross section which shows the profile of the box member 10 and cover 50 to better advantage. The base 12 of member 10 has a flat outside surface 14 opposing inside surface 13 which is bounded by upstanding wall 16 having inner wall 20 and outer wall 25 on the top thereof. The inner wall 20 has an inside surface 21, an outside surface 22, and a distal surface 23. The outer wall 25 has an inside surface 26, an outside surface 27, and a distal surface 28 which is lower than distal surface 23. The distal surfaces 23, 28 lie in parallel planes. The inside surfaces 21, 26 and floor 30 define channel 18. The web 52 of cover 50 has an outside surface 54 opposing inside surface 53, which is bounded by bottom wall 70 from which flanges 60, 65 extend. First or lower flange 60 has an inside surface 61, an outside surface 62, and a distal surface 63. Second or upper flange 65 likewise has an inside surface 66, an outside surfce 67, and a distal surface 68. Bottom wall 70 has inside surface 71 and outside surface 72. The surfaces 61, 66, 72 define outward facing channel 58.

Referring still to FIG. 2, compression bolts 85 each have an axial bore 87 therethrough which is profiled to receive insulated wire 2. This need not be a close fit, as sealing and strain relief are accomplished by spherical seal 92. The seal 92 has a diametric bore 94 therethrough which may likewise be somewhat loose on the wire 2, since sealing is accomplished by deforming the seal 92 so that bore 94 collapses into conformity with wire 2. The seal is trapped between justoconical surface 88 on the leading edge of bore 87 and frustoconical surface 35 between a threaded portion 33 and a constricted portion 34 of bore 32 through upstanding wall 16. Annular groove 95 in bore 94 is provided to break the capillary action of any water which may seep in.

Terminals 100 are prepared for termination by first assembling screw 114 to stuffer 107 by fitting head 115 through slot 112 in sidewall 108 of the stuffer 107. The head 115 bears against bight 110 as screw 114 moves upward through aperture 106 under the action of a screwdriver in slot 118. Wire 2 may then be inserted through apertures 103 in respective sidewalls 102, and the stuffer 107 brought to bear by turning screw 114 in the opposite direction. V-notches 109 cut into the top of wire 2 while V-notches 104 in the apertures 103 cut into the bottom of wire 2.

Cam screw 80 is assembled to cover 50 by insertion through bore 76 until it rests on shoulder 79. Elastomeric gasket 83 is stretched over cam shoulders 81 and annular rib 82 to retain the screw 80 to cover 50 for field use. Hub-like projection 74 is axially aligned with hub-like projection 40 on base 12 so that screw 80 can be received in bore 42 and rotated ninety degrees to lock shoulders 81 against shoulders 46. The gasket 83 is compressed between the flat distal surfaces 43, 77 of respective projections 40, 74, which are profiled with circular grooves 44, 78 to break capillary action of seeping water.

FIG. 3 is a perspective of the assembled enclosure. The cover 50 is held fast to box member 10 by can screw 80 with upper or second flange 65 nearly against outer wall 25 as will be described. Compression bolts 85 with wires 2 therethrough are screwed snugly against member 10 to provide sealing and strain relief.

FIG. 4 shows the assembled enclosure in cross section. Screw 80 has been turned so that the detent on cam shoulder 81 receives the apex of cam shoulder 46 in bore 42 to lock the cover 50 to box member 10. The outside surface 62 of lower flange 60 is substantially flush with floor 30 of channel 18. Referring to FIG. 4A, the inside surface 71 of bottom wall 70 is substantially flush with inside 21 surface 21 of inner wall 20, and the distal surface 23 of inner wall 20 is substantially flush with the inside surface 53 of cover 50. The fit of the foregoing surfaces is not critical, normal manufacturing tolerances being sufficient. Still referring to FIG. 4A, the intersection of inner surface 71 and outside surface 62 forms an outer radius of curvature 64. The intersection of inside surface 21 and floor 30 form an inside radius of curvature 69. When the cover 50 is placed onto the box member 10, the outer radius 64 is disposed adjacent to the inner radius 69, although a gap exists between the two radii. What is critical to the invention is that a gap exist between distal surface 28 of outer wall 25 and inner surface 66 of top flange 65 where flange 65 overlaps the wall 25. Another critical design parameter is the cross section of channel 58 as enclosed by outer wall 25. These dimensions are critical to making the assembly watertight without a conventional elastomeric or otherwise deformable seal. The gap should be large enough to allow water to drip out when the cover 50 is assembled to box member 10 when the assembly is mounted on a vertical surface, yet small enough to inhibit direct influx of rain water. A gap of 0.010 inch has been found to be satisfactory. The cross section of the air space or duct 73 enclosed by channel 58 and outer wall 25 should be large enough to permit flow to the opposite side of the box and out, rather than beading up due to the effects of surface tension when the box is mounted vertically. A minimum cross section of 0.125 inch by 0.125 inch has been found satisfactory.

FIG. 4 also shows seal 92 compressed into comformity with wire 2 between bolt 85 and constricted portion 34 of bore 32. The travel of bolt 85 is limited by shoulder 89 bearing against wall 16 so that the seal 92 is only partially extruded into constricted portion 34 without being completely forced into the box member 10. The resulting tight fit on wire 2 acts as strain relief between outside forces on wire 2 and the inside termination to terminal 100. Referring to FIGS. 4 and 5, wires 2 are terminated to terminals 100 by assembling the stuffer 107 to terminal 100 with screw 114 as previously described, and backing up screw 114 to force the stuffer 107 against wire 2. This termination is directed to stranded conductors 4, which are forced into conformity with V-notches 104, 109 as the apertures 103 in sidewalls 102 are constricted and the insulation is displaced.

The foregoing description is exemplary and not intended to limit the scope of the claims which follow.

I claim:

1. A rain tight enclosure which comprises:
   a first closure member having a first circumferential channel opening in one direction, said first channel being defined by an inner wall, an outer wall, and a floor therebetween;
   a second closure member having a second circumferential channel opening outward, said second channel being defined by a first flange, a bottom wall extending downwardly from said first flange, and a second flange, contiguous with said bottom wall, substantially parallel to said first flange, said second channel being profiled to be received in said first channel when said second closure member is placed over said first closure member, the intersection of the first and second channels forming a peripherally extending duct about an interior of said enclosure.

2. The enclosure of claim 1 wherein when the second closure member is placed over the first closure member, the second flange of the second closure member is disposed adjacent to the floor of the first closure member.

3. The enclosure of claim 2 wherein when the second closure member is placed over the first closure member, the bottom wall of the second closure member is disposed adjacent to the inner wall of the first closure member.

4. The enclosure of claim 3 wherein the intersection of the inner wall and the floor forms an inner radius.

5. The enclosure of claim 4 wherein the intersection of the bottomwall and the second flange forms an outer radius.

6. The enclosure of claim 5 wherein when the second closure member is placed over the first closure member, the outer radius of the second closure member is disposed adjacent the inner radius of the first closure member.

7. The enclosure of claim 6 wherein a gap exists between the first and second closure members at the location of the intersection of the inner and outer radii.

8. The enclosure of claim 1 wherein a distal tip on the outer wall of the first closure member is substantially planar to the first flange on the second closure member.

9. The enclosure of claim 8 wherein when the second closure member is placed over the first closure member, the distal tip on the inner wall abuts the first flange on the second closure member.

10. The enclosure of claim 9 wherein the distance between the first flange of the second closure member and the distal tip of the outer wall of the first closure member forms a peripheral opening in communication with the peripherally extending duct.

11. The enclosure of claim 10 wherein the opening is dimensioned to inhibit direct influx of rain water.

12. The enclosure of claim 10 wherein the opening is large enough to allow water to drip out of the duct when the enclosure is inverted.

13. The enclosure of claim 1 wherein the inner wall of said first channel is higher upstanding than the outer wall of said first channel.

* * * * *